(12) United States Patent
Nakao

(10) Patent No.: US 6,441,763 B1
(45) Date of Patent: Aug. 27, 2002

(54) DA CONVERTER AND LIQUID CRYSTAL DRIVING DEVICE INCORPORATING THE SAME

(75) Inventor: Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/911,725

(22) Filed: Jul. 25, 2001

(30) Foreign Application Priority Data

Jul. 25, 2000 (JP) ........................................ 2000-224409

(51) Int. Cl.$^7$ ............................................... H03M 1/78
(52) U.S. Cl. ...................................... 341/154; 341/153
(58) Field of Search ................................. 341/154, 153, 341/150, 144

(56) References Cited

U.S. PATENT DOCUMENTS 6,169,509 B1 * 1/2001 Abe ............................ 341/150
6,373,419 B1 * 4/2002 Nakao ......................... 341/154

* cited by examiner

Primary Examiner—Peguy JeanPierre
Assistant Examiner—Joseph J Lauture

(57) ABSTRACT

A DA converter is for converting N-bit digital signals to $2^N$ analog signals, and includes a reference voltage generating circuit for generating the reference voltages having $2^A+1$ voltage levels, a reference voltage selector circuit for selecting two reference voltages having adjacent voltage levels according to the A bits of a digital signal, an output voltage selector circuit for selecting one interpolation voltage from $2^{N-A}-1$ interpolation voltages predetermined between the voltage levels of the two reference voltages in accordance with the N-A bits of the digital signal, and a voltage follower circuit for producing the above interpolation voltage by linear interpolation based on the two reference voltages. With this structure, in a DA converter and a liquid crystal driving device incorporating the DA converter, despite a possible increase in the number of voltages required for a display with more gradation levels, large increases in the number of circuit composing elements can be avoided, thus preventing an increase in manufacturing cost and permitting the production of more compact devices.

22 Claims, 11 Drawing Sheets

FIG. 4

| GRADATION | Bit 5 | Bit 4 | Bit 3 | Bit 2 | Bit 1 | Bit 0 | IN$_3$ | IN$_2$ | IN$_1$ | $V_{out} = (VIN_3+VIN_2+VIN_1\times 2)/4$ |
|---|---|---|---|---|---|---|---|---|---|---|
| 0 | 0 | 0 | 0 | 0 | 0 | 0 | V$_0$ | V$_0$ | V$_0$ | V0 |
| 1 | 0 | 0 | 0 | 0 | 0 | 1 | V$_0$ | V$_0$ | V$_0$ | (V$_0$+V$_4$+V$_0$×2)/4 |
| 2 | 0 | 0 | 0 | 0 | 1 | 0 | V$_0$ | V$_4$ | V$_0$ | (V$_0$+V$_0$+V$_4$×2)/4 |
| 3 | 0 | 0 | 0 | 0 | 1 | 1 | V$_0$ | V$_4$ | V$_4$ | (V$_0$+V$_4$+V$_4$×2)/4 |
| 4 | 0 | 0 | 0 | 1 | 0 | 0 | V$_4$ | V$_4$ | V$_4$ | V4 |
| ... | ... | ... | ... | ... | ... | ... | ... | ... | ... | ... |
| 59 | 1 | 1 | 1 | 0 | 1 | 1 | V$_{56}$ | V$_{60}$ | V$_{60}$ | (V$_{56}$+V$_{60}$+V$_{60}$×2)/4 |
| 60 | 1 | 1 | 1 | 1 | 0 | 0 | V$_{60}$ | V$_{60}$ | V$_{60}$ | V60 |
| 61 | 1 | 1 | 1 | 1 | 0 | 1 | V$_{60}$ | V$_{64}$ | V$_{60}$ | (V$_{60}$+V$_{64}$+V$_{60}$×2)/4 |
| 62 | 1 | 1 | 1 | 1 | 1 | 0 | V$_{60}$ | V$_{60}$ | V$_{64}$ | (V$_{60}$+V$_{60}$+V$_{64}$×2)/4 |
| 63 | 1 | 1 | 1 | 1 | 1 | 1 | V$_{60}$ | V$_{64}$ | V$_{64}$ | (V$_{60}$+V$_{64}$+V$_{64}$×2)/4 |

DA CONVERTER AND LIQUID CRYSTAL DRIVING DEVICE INCORPORATING THE SAME

FIELD OF THE INVENTION

The present invention relates to a DA converter incorporated in liquid crystal driving and other devices, and further relates to a liquid crystal driving device incorporating such a DA converter.

BACKGROUND OF THE INVENTION

A DA (digital-to-analog) converter converts externally inputted digital signals to analog signals. For example, in a liquid crystal driving device of an active matrix liquid crystal display device, a DA converter is used to convert externally inputted digital signals, which constitute display data, to analog signals, and to send the analog signals to a liquid crystal display section. Some DA converters of this kind include an OP-amplifier composed of MOS transistors.

FIGS. 10 and 11 show a detailed structure of a DA converter 100 incorporated in a liquid crystal driving device as mentioned above, which converts display data in the form of digital signals to analog voltages for outputs.

The DA converter 100 is made up of a selector circuit 106 [corresponding to a selector circuit 16 of a DA converter 10 of the present invention (FIG. 9)], which is a DA conversion circuit; a voltage follower circuit 107 (corresponding to a voltage follower circuit 17 in FIG. 9), which is an output circuit; and a reference voltage generating circuit 108 (corresponding to a reference voltage generating circuit 18 in FIG. 9). FIG. 10 shows an example of a structure of a DA converter incorporated in a 64-level gradation liquid crystal driving which outputs 64 analog voltages in accordance with 6-bit digital signals (Bit 5 to Bit 0). FIG. 11 is an enlarged view of the section from $V_{48}$ to $V_{64}$ of the reference voltage generating circuit 108 and the selector circuit 106 (the section B in FIG. 10). The structure of the reference voltage generating circuit 108 and the selector circuit 106 shown in FIG. 10 is arranged such that the structural pattern shown in FIG. 11 are repeated.

The reference voltage generating circuit 108 generates a plurality of reference voltages (64 reference voltages in this example) in accordance with the display data provided in the form of digital signals. The selector circuit 106, which is made up of MOS transistor switches, selects one of the reference voltages for output. The structure of the switches will be described later in detail.

The voltage follower circuit 107 outputs the voltage selected by the selector circuit 106 through a liquid crystal driving voltage output terminal (corresponding to a liquid crystal driving voltage output terminal 17t in FIG. 9) to a liquid crystal display element,; as a liquid crystal driving signal.

Generally, the reference voltage generating circuit 108 is commonly used for a plurality of liquid crystal driving voltage output terminals.

Meanwhile, one selector circuit 106 and one voltage follower circuit 107 are provided for each liquid crystal driving voltage output terminal. In the case of a color display, a liquid crystal driving voltage output terminal is used corresponding to each color, thus one selector circuit 106 and one voltage follower circuit 107 are provided for each color in a pixel. That is, supposing that the total number of pixels in a liquid crystal panel (corresponding to a liquid crystal panel 21 in FIG. 5) is N, and liquid crystal driving voltage output terminals for red, green, and blue are expressed as R, G, and B, respectively with a subscript n (n=1, 2, . . . , N), the liquid crystal panel has liquid crystal driving voltage output terminals $R_1, G_1, B_1, R_2, G_2, B_2, \ldots$) $R_N, G_N, B_N$, therefore 3N selector circuits 106 and 3N voltage follower circuits 107 are required.

The following description will explain the structure and operation of the DA converter 100 incorporated ;in the liquid crystal driving device.

The reference voltage generating circuit 108 is structured such that 64 resistor elements are connected in series, and a largest liquid crystal driving voltage $V_{64}$ and a smallest liquid crystal driving voltage $V_0$ are inputted to the respective end terminals. Therefore, 64 voltages ($V_0$ to $V_{63}$) are generated respectively from between the resistor elements, in proportion to the resistance of the resistor elements connected. These 64 different voltages generated from the reference voltage generating circuit 108 are inputted to the selector circuit 106.

In the selector circuit 106, the MOS transistor switches are arranged so as to select one of the 64 inputted voltages for output in accordance with the display data composed of a 6-bit digital signal. That is, the switches are turned on or off in response to each piece of display data composed of a 6-bit digital signal (Bit 0 to Bit 5), thus one of the 64 inputted voltages is selected for output. The following description will explain voltage selection procedures in detail.

In a 6-bit digital signal, Bit 5 is MSB (Most Significant Bit), and Bit 0 is LSB (least Significant Bit). The switches are paired in two to form switch pairs. Therefore, Bit 0 is provided with 32 switch pairs (64 switches), and Bit 1 is provided with 16 switch pairs (32 switches). AS moving up from a certain bit to a next bit, the number of switch pairs decreases by half, down to a single switch pair (two switches) for Bit 5. So the total number of the switch pairs in the selector circuit 106 amounts to $1+2+2^2+2^3+2^4+2^5=63$ (126 switches).

The two switches of a switch pair operate such that, if the corresponding bit is "0", the upper switch in the figure turns off, and the lower switch turns on. In contrast, if the corresponding bit is "1", the upper switch turns on, and the lower switch turns off. For example, referring to the example in FIG. 12, Bit 5, Bit 4, . . . , Bit 0 is "111111", so all the upper switches are on and all the lower switches are off, allowing the voltage $V_{63}$ to be outputted from an output terminal of the selector circuit 106. Further, for example, if Bit 5, Bit 4, . . . , Bit 0 is "000001", the voltage $V_1$ is outputted from an output terminal of the selector circuit 106.

The voltage follower circuit 107 provides a voltage identical to the analog voltage outputted from the selector circuit 106, for output via the liquid crystal driving voltage output terminal as a liquid crystal driving signal having a smaller internal resistance.

There is a trend in recent years for liquid crystal display devices to include more minute structure and display more gradation levels, resulting in increases in the size of circuits in liquid crystal driving devices. Meanwhile, as liquid crystal display devices find applications in more fields, there are increasingly higher demands for cheaper liquid crystal display devices and stronger needs to reduce manufacturing costs by manufacturing smaller liquid crystal driving devices. Further, in terms of portability, there are strong demands for smaller liquid crystal display devices including liquid crystal driving devices, which adds the importance of the reduction in the size of liquid crystal driving devices.

However, when the foregoing conventional DA converter 100 is used as a liquid crystal driving device of a liquid crystal display device, the number of circuit composing elements increases sharply in accordance with an increase in the number of the gradation levels to be displayed. For example, in the case of a liquid crystal driving device providing a 64-level gradation display using 6-bit digital signals, 64 resistor elements are required in the reference voltage generating circuit 108, and 126 switches are required for every pixel to form the selector circuit 106. In the same manner, in the case of a liquid crystal driving device providing a 256-level gradation display using 8-bit digital signals, 256 resistor elements are required in the reference voltage generating circuit 108, and 510 switches are required for every pixel to form the selector circuit 106, as it includes $1+2+2^2+2^3+\ldots+2^7=255$ switch pairs. Further, when performing a color display, since there are three primary colors (red, green, and blue), the number of the resistor elements and switches required triples.

In this manner, the liquid crystal driving device in accordance with conventional technology requires an increasingly large number of circuit composing elements according to the increase in the number of the colors to be displayed, that is, the increase in the number of voltages required to provide more gradation levels. In addition, a higher definition display requires greatly larger number of the circuit composing elements. Therefore, the cost for manufacturing the liquid crystal driving display sharply increases, and the chip size grows when the liquid crystal driving device is fabricated as an integrated circuit, which renders it difficult to reduce the size.

SUMMARY OF THE INVENTION

The present invention has an object to offer a DA converter which restrains sharp increases in the number of circuit composing elements (resistor elements and switches) despite a possible increase in the number of voltages required, therefore suppressing increases in manufacturing cost and being provided in a more compact size.

The present invention has another object to offer a liquid crystal driving device which restrains large increases in the number of circuit composing elements despite a display with more gradation levels and higher definition, therefore suppressing increases in manufacturing cost and being provided in a more compact size.

In order to achieve the objects, a DA converter in accordance with the present invention includes:
- a reference voltage generating circuit for generating the reference voltages;
- a reference voltage selector circuit for selecting two reference voltages having adjacent voltage levels so as to include the voltage level of an output voltage between the voltage levels of the two reference voltages;
- an output voltage selector circuit for selecting the voltage level of the output voltage from a plurality of voltage levels predetermined between the voltage levels of the two reference voltages; and
- a voltage generating circuit for generating a voltage having the voltage level selected by the output voltage selector circuit as the output voltage, based on the two reference voltages.

According to the foregoing structure, the DA converter generates interpolation voltages which: have voltage levels not generated by the reference voltage generating circuit, based on the reference voltages generated by the reference voltage generating circuit. As a result, the DA converter can output voltages not generated by the reference voltage generating circuit (interpolation voltages) as well as the voltages generated by the reference voltage generating ciircuit (reference voltages) as the output voltages. Further, in the DA converter, the voltage level of an interpolation voltage can be selected from a plurality of voltage levels predetermined between adjacent reference voltages.

Consequently, in the DA converter, a part of the voltage levels required to provide an output voltage can be generated by interpolation, permitting the reduction in the number of voltages generated by the reference voltage generating circuit less than the number required. Therefore, the number of elements in the reference voltage generating circuit and in the reference voltage selector circuit can be greatly reduced in comparison with conventional technology.

Therefore, despite a possible increase in the number of voltages required, large increases in the number of circuit composing elements such as resistor elements and switches can be avoided, thus preventing an increase in manufacturing cost and permitting the production of more compact devices.

Further, a liquid crystal driving device in accordance with the present invention is arranged so as to include the DA converter.

With this arrangement, the liquid crystal driving device can restrain large increases in the number of circuit composing elements despite a display with more gradation levels and higher definition, therefore suppressing increases in manufacturing cost and being provided in a more compact size.

Therefore, the reduction in the size of the reference voltage selector circuit, which occupies a large size in a liquid crystal driving circuit, permits a great reduction in chip size and substantially contributes to the resulting cost reduction. In addition, the reduction in the size of the circuit in a liquid crystal driving device allows a liquid crystal display device incorporating the liquid crystal driving device to be provided in a more compact size. Therefore, high quality display devices with higher resolution and more gradation display capabilities using increasingly large number of pixels can be realized, as well as more compact display devices can be provided.

For a fuller understanding of the nature and advantages of the invention, reference should be made to the ensuing detailed description taken in conjunction with the accompanying drawings.

BRIEF DESCRIPTION OF THE DRAWINGS

FIG. 4 is an explanatory view showing the relationship between the display data and the output voltage in the DA converter shown in FIG. 1.

DESCRIPTION OF THE PREFERRED EMBODIMENTS

Referring to FIGS. 1 through 9, the following description will explain an embodiment in accordance with the present invention.

A DA converter 10 of the present embodiment (shown in FIGS. 1 and 9) is provided with an OP-amplifier made up of MOS transistors, and can be used especially for a liquid crystal driving device of an active matrix liquid crystal display device, as well as other purposes.

First, referring to FIGS. 5 to 9, the following description will explain a structure of a liquid crystal display device incorporating the DA converter 10, a structure of a liquid crystal panel of the liquid crystal display device, liquid crystal driving waveforms thereof, and a structure of source drivers provided in the liquid crystal display device.

Figure 5:
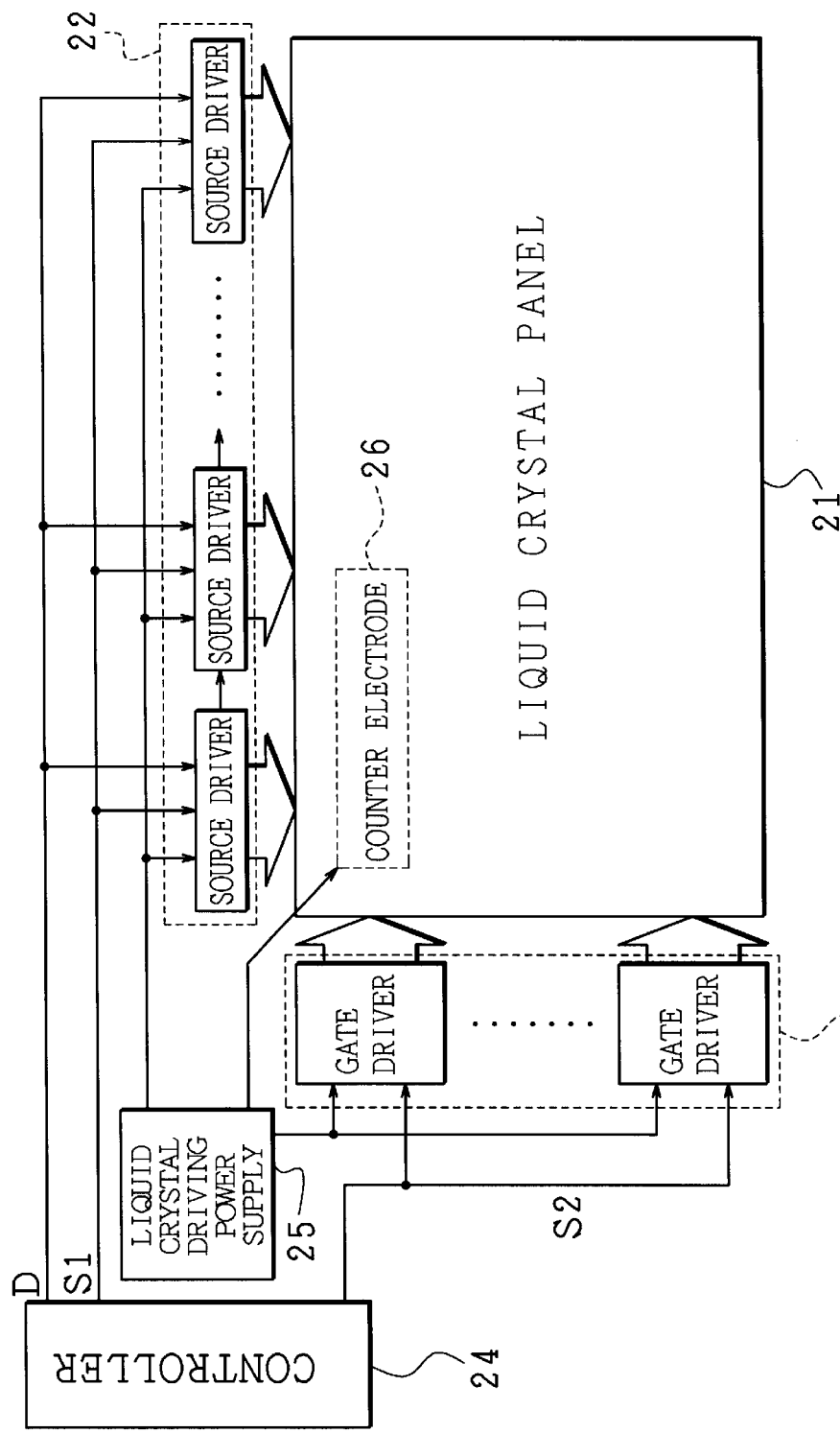
FIG. 5 is a block diagram showing a schematic structure of a liquid crystal display device equipped with the DA converter shown in FIG. 1.

FIG. 5 constitutes a block diagram showing a structure of a TFT (Thin Film Transistor) liquid crystal display device 20, a typical active matrix liquid crystal display device.

The liquid crystal display device 20 is divided into two parts: a liquid crystal display section and a liquid crystal driving circuit (liquid crystal driving device) for driving the liquid crystal display section. The liquid crystal display section includes a TFT liquid crystal panel 21, and the liquid crystal panel 21 includes liquid crystal display elements (not shown) and counter electrodes 26 (common electrodes) which will be described later.

Meanwhile, the liquid crystal driving circuit includes source drivers 22 and gate drivers 23, each driver being composed of an IC (Integrated Circuit), a controller 24, and a liquid crystal driving power supply 25. The controller 24 inputs display data D and control signals S1 to the source drivers 22, and inputs control signals S2 to the gate drivers 23. Thus, the controller 24 inputs vertical synchronized signals to the gate drivers 23, and inputs horizontal synchronized signals to the source drivers 22 and the gate drivers 23.

The externally provided display data is inputted in the form of digital signals via the controller 24 to the source drivers 22, as the display data D. The source drivers 22 latch the incoming display data by time-sharing, and thereafter, convert the display data from digital to analog in synchronization with the horizontal synchronized signals inputted from the controller 24. Then, the analog voltages obtained by the DA conversion for gradation display (gradation display voltages) are inputted via liquid crystal driving voltage output terminals 17t (shown in FIG. 9, will be described later) and source signal lines 34 (shown in FIG. 6, will be described later) to liquid crystal display elements (not shown), each element corresponding to each liquid crystal driving voltage output terminal 17t, of the liquid crystal panel 21.

Figure 6:
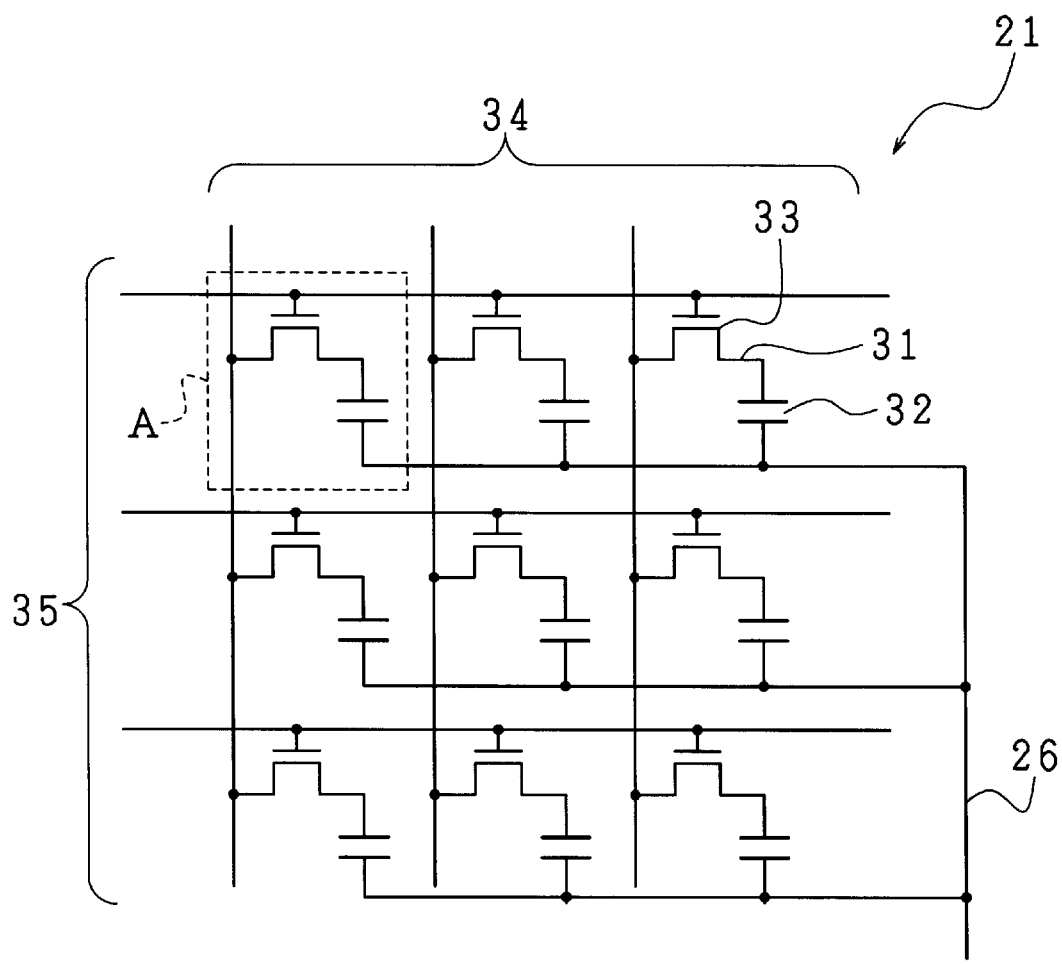
FIG. 6 is a circuit diagram showing a structure of a liquid crystal panel of the liquid crystal display device shown in FIG. 5.

FIG. 6 shows a structure of the liquid crystal panel 21. The liquid crystal panel 21 includes pixel electrodes 31, pixel capacitors 32, TFTs 33 as elements for turning on/off voltage application to the pixels, the source signal lines 34, gate signal lines 35, and the counter electrodes 26. Here, the area A in the figure shows a liquid crystal display element for one pixel.

The source drivers 22 (shown in FIG. 5) provide the source signal lines 34 with gradation display voltages according to the luminance of pixels to be displayed. The gate drivers 23 (shown in FIG. 5) provide the gate signal lines 35 with scanning signals so as to sequentially turn on the vertically lined TFTs 33 in FIG. 6. Then, through the TFT 33 which is in an ON state, the voltage in the source signal line 34 is applied to the pixel electrode 31 connected to the drain of the TFT 33, causing accumulation of charges in the pixel capacitor 32 formed between the pixel electrode 31 and the counter electrode 26. The accumulation of charge alters the optical transmittance of the liquid crystal and provides a display of the pixel.

Figure 7:
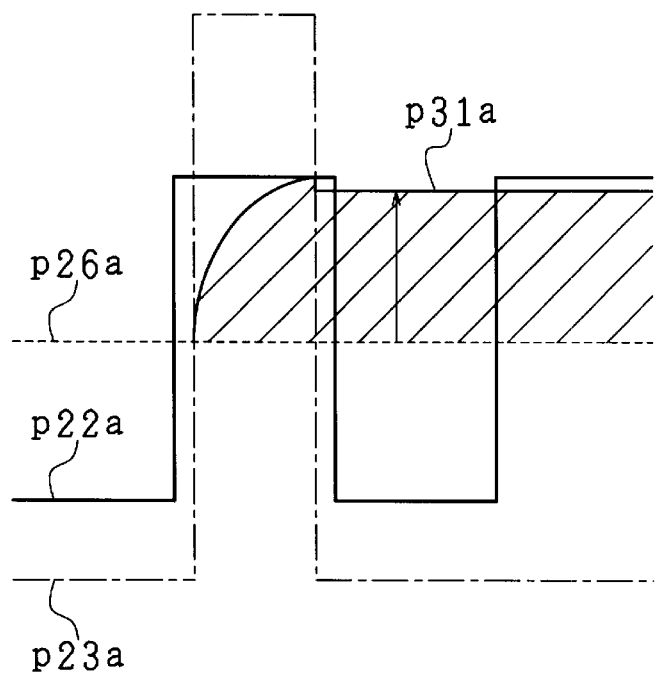
FIG. 7 is an explanatory view showing a liquid crystal driving waveform of the liquid crystal display device shown in FIG. 5.
Figure 8:
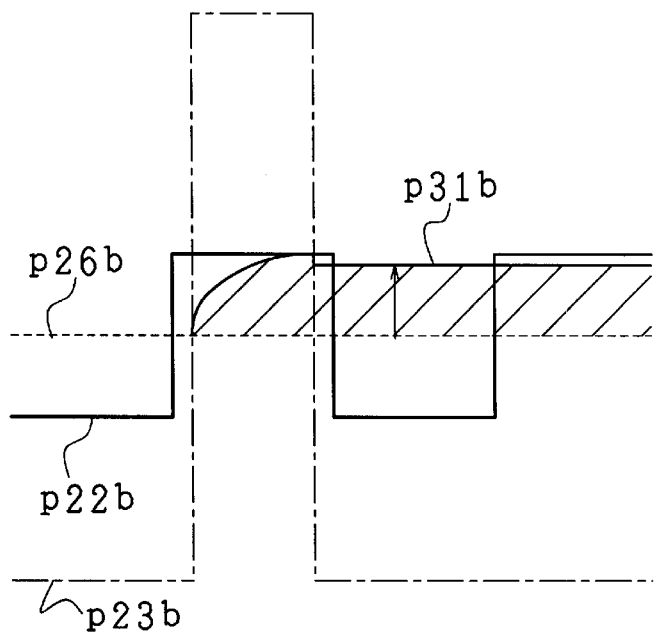
FIG. 8 is an explanatory view showing a liquid crystal driving waveform of the liquid crystal display device shown in FIG. 5.

FIGS. 7 and 8 show examples of liquid crystal driving waveforms of the liquid crystal panel 21. FIGS. 7 and 8 respectively show driving waveforms p22a and p22b of the source driver 22, driving waveforms p23a and p23b of the gate driver 23, potentials p26a and p26b of the counter electrode 26, and voltage waveforms p31a and p31b of the pixel electrode 31. The voltage applied across a liquid crystal material is equivalent to the potential difference between the pixel electrode 31 and the counter electrode 26, which is shown as shaded areas in FIGS. 7 and 8.

For example, in FIG. 7, the TFT 33 is turned on when a potential is in a high level, and the difference between the driving waveform p22a of the source driver 22 and the potential p26a of the counter electrode 26 is applied to the pixel electrode 31. Subsequentliy, a potential becomes low level in the driving waveformt p23a of the gate driver 23, then the TFT 33 is turned off. Here, the presence of the pixel capacitor 32 enables the foregoing voltage to be retained at the pixel, like the voltage waveform p31a. FIG. 8 shows a case where a voltage applied to the liquid crystal material is lower than that in FIG. 7, but the operation is otherwise the same as that in FIG. 7.

In this manner, in the liquid crystal display device 20, a display with multiple levels of gradation is achieved by varying a voltage applied to the liquid crystal material of the liquid crystal panel 21 as an analog voltage, and thus altering the optical transmittance of the pixel in an analog manner. Therefore, the number of displayable gradation levels is determined by the number of analog voltages available to be applied to the liquid crystal material.

Figure 9:
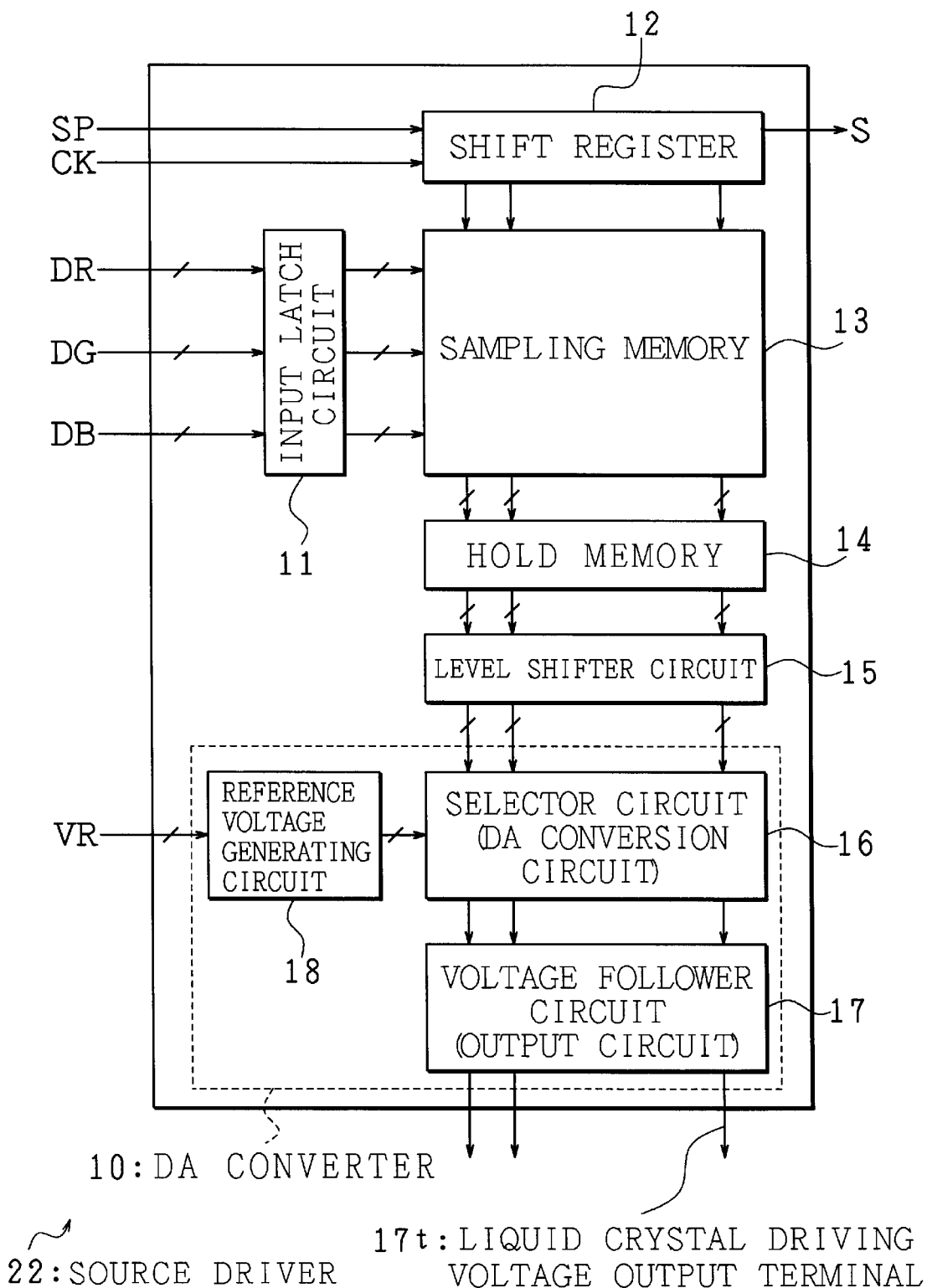
FIG. 9 is a block diagram showing a schematic structure of a source driver provided in the liquid crystal display device shown in FIG. 5.
Figure 10:
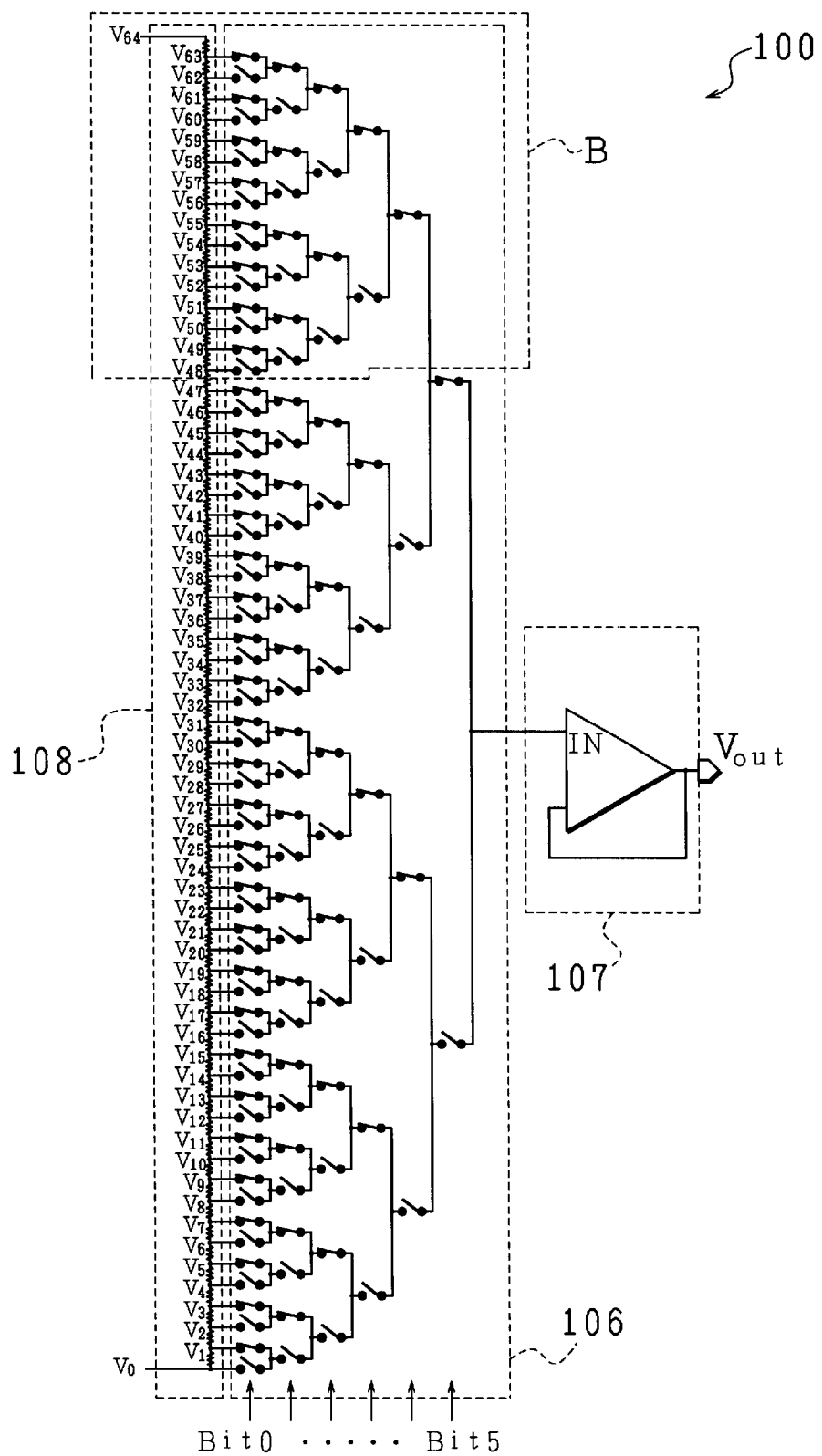
FIG. 10 is a circuit diagram showing a structure of a conventional DA converter.
Figure 11:
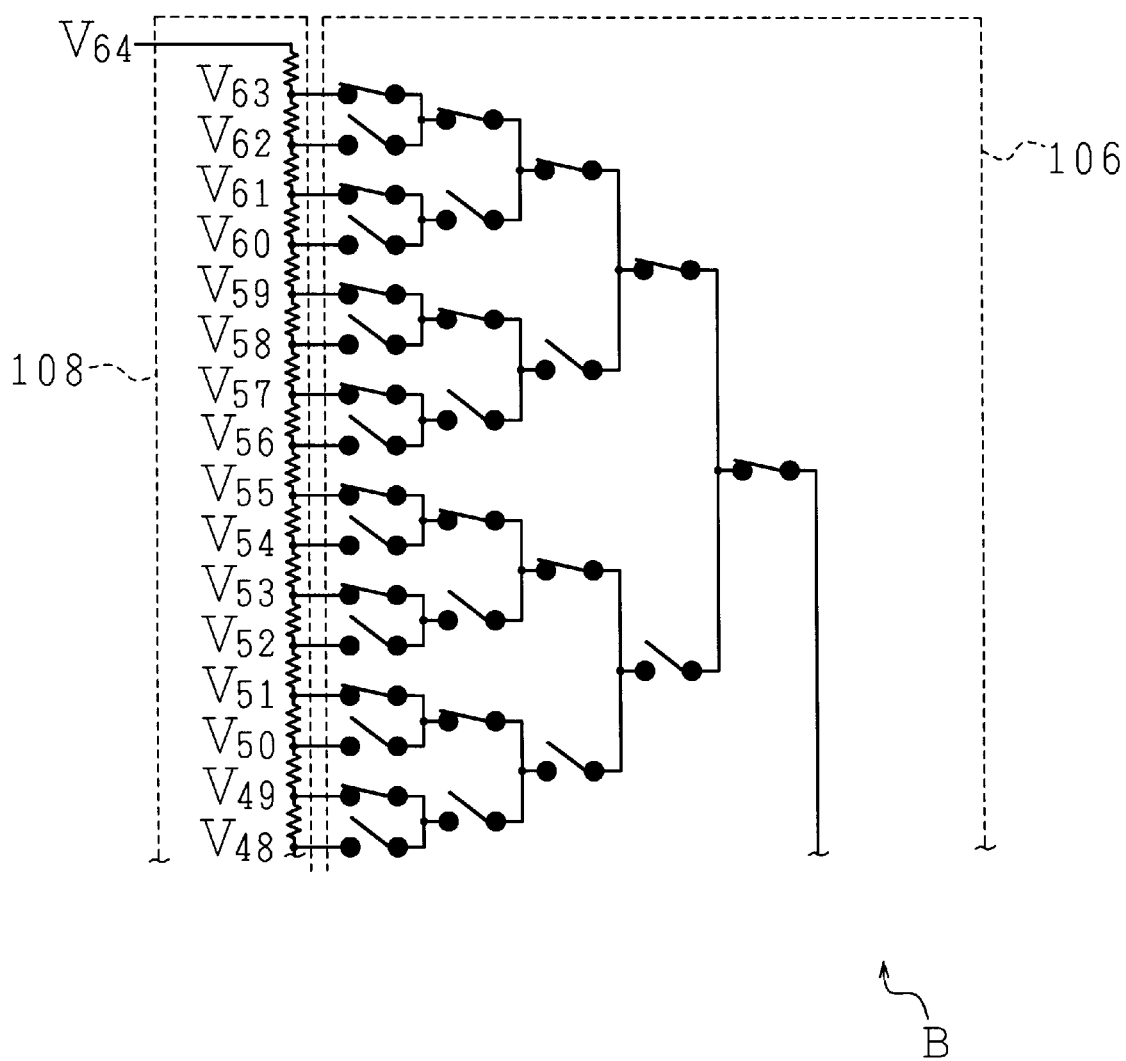
FIG. 11 is a circuit diagram showing a part of the structure of the conventional DA converter shown in FIG. 10.

FIG. 9 shows an example of a block diagram of the source driver 22. Display data, inputted as digital signals, include display data DR, DG, and DB for respective primary colors R (red), G (green), and B (blue). The display data is temporarily latched by an input latch circuit 11, and thereafter stored in a sampling memory 13 by time-sharing in accordance with the operation of a shift register 12 which receives a start pulse SP and shifts with a clock CK. Then the whole data is simultaneously transferred to a hold memory 14 based on a horizontal synchronized signal (not shown). S represents cascade outputs. A reference voltage generating circuit (reference voltage generating means) 18 generates reference voltages of respective levels according to a reference voltage VR. The display data in the hold memory 14 is sent via a level shifter circuit 15 to a selector circuit [DA (digital to analog) conversion circuit] 16 where the data is converted to analog voltages based on the reference voltages of respective levels provided by the reference voltage generating circuit 18. Then, the data is outputted by a voltage follower circuit (output voltage generating means) 17, which is an output circuit, through the liquid crystal driving voltage output terminals 17t to respective liquid crystal display elements (not shown: see the area A in FIG. 6), as gradation display voltages.

Here, the DA converter 10 is composed of the selector circuit 16, the voltage follower circuit 17, and the reference voltage generating circuit 18. In addition, in the liquid crystal display device 20, the DA converter 10 is used to form a liquid crystal driving circuit in the foregoing manner, and as mentioned above, the DA converter 10 converts digital data (display data DR, DG, DB for each primary color) from digital to analog for a display on the liquid crystal panel 21, and applies the converted analog data to the respective liquid crystal display elements.

Referring to FIGS. 1 through 4, the following description will explain the DA converter 10 in detail.

First, referring to FIG. 1, the structure of the selector circuit (selecting means) 16, the voltage follower circuit (output means) 17, and the reference voltage generating circuit (reference voltage generating means) 18 will be explained. Besides these circuits, the DA converter 10 may also include a circuit for adjusting the luminance of a liquid crystal display.

Figure 1:
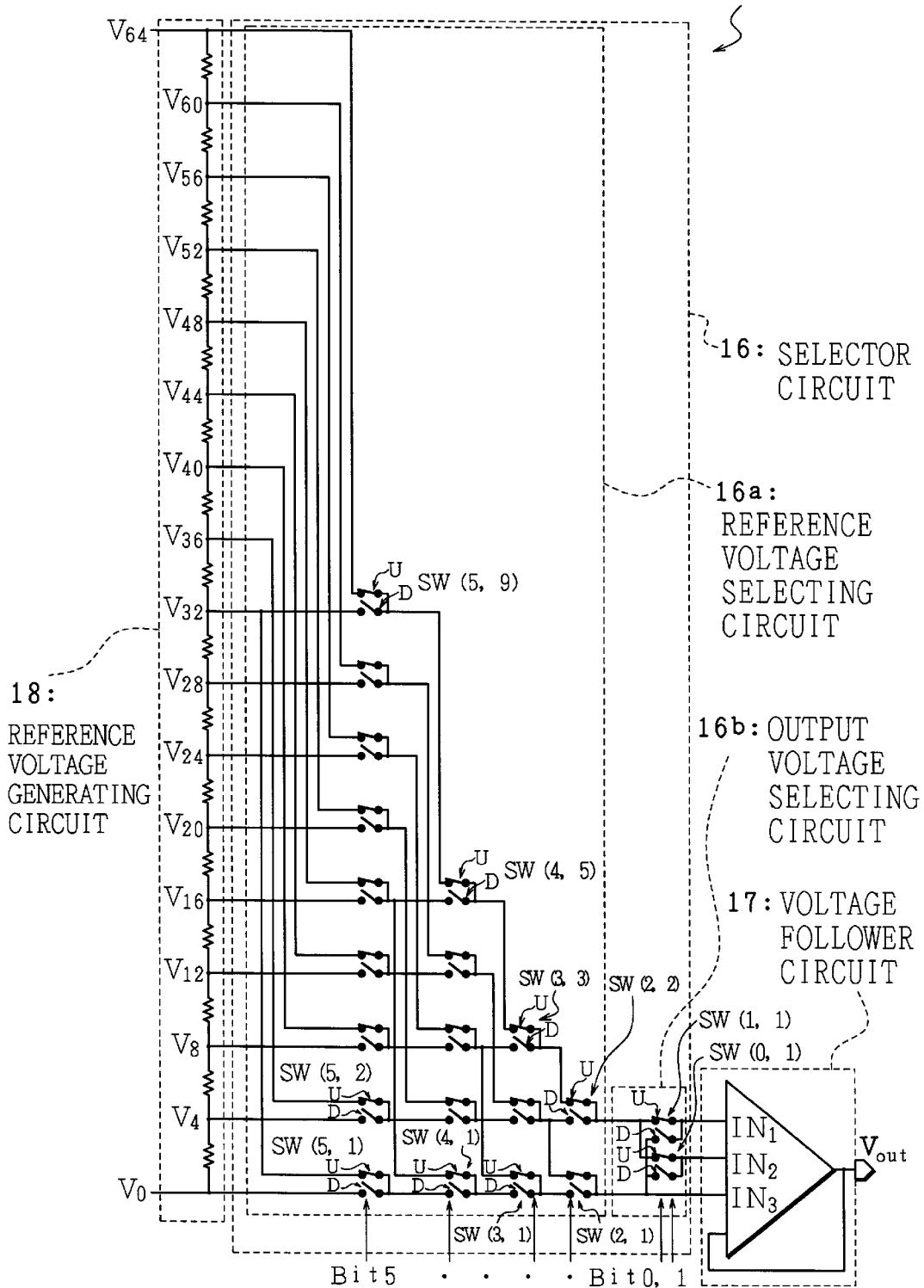
FIG. 1 is a circuit diagram showing a schematic structure of a DA converter in accordance with an embodiment of the present invention.

The DA converter 10 shown in FIG. 1 is an example of the structure where 64 analog voltages required for a 64-level gradation display are outputted from 6-bit display data. In the display data, Bit 5 is MSB, and Bit 0 is LSB.

As shown in FIG. 1, the DA converter 10 includes the reference voltage generating circuit 18, which is a resistance type potential divider circuit. That is, the reference voltage generating circuit 18 is a resistance type potential divider circuit where a plurality of resistor elements are connected one another to generate reference voltages from the connected sections between the resistor elements. The reference voltage generating circuit 18 is structured such that 16 resistor elements are connected in series, and receives an input, of a maximum liquid crystal driving voltage ($V_{64}$) at one of the end terminals and an input of a minimum liquid crystal driving voltage ($V_0$) at the other end terminal. With this structure, 17 voltages ($V_0$, $V_4$, $V_8$, . . . , $V_{60}$, $V_{64}$) are generated from the terminals of respective resistor elements in proportion to the resistance values of the resistor elements. Here, the 17 voltages correspond to the liquid crystal driving voltages that create every four gradation levels.

Next, the following description will explain the circuit structure and input/output relationship of the selector circuit 16.

As shown in FIG. 1, the DA converter 10 includes the selector circuit 16 which has three output terminals. The selector circuit 16 selects one or two suitable voltages among the 17 voltages inputted from the reference voltage generating circuit 18 for an output, according to 6-bit display data (a digital display signal). The selector circuit 16 may be arranged so as to be composed of analog switches such as MOS transistors and transmission gates. The switches are paired in two to form switch pairs to select and output one of two input signals according to the 6-bit display data.

Here, the selector circuit 16 includes a reference voltage selector circuit (reference voltage selecting means) 16a [including SW (5) to SW (2)], which selects two reference voltages having adjacent voltage levels according to Bit 5 to Bit 2 (reference voltage selecting bits) of the display data; and an output voltage selector circuit (output voltage selecting means) 16b [including SW (1) and SW (0)], which selects one of the voltage levels (that is, gradation levels) of interpolation voltages predetermined between the two reference voltages selected by the reference voltage selector circuit 16a, according to Bit 1 and Bit 0 (output voltage selecting bits) of the display data.

In FIG. 1, the switch pair is denoted as SW(x,y) where x is an integral number 0, 1, 2, . . . , 5, in this order from the right in FIG. 1, and coincides with a digit in the bits, y is an integral number 0, 1, 2, . . . , representing a vertical position in FIG. 1 in this order from the bottom in FIG. 1. Further, to distinguish one of the switches from the other in a switch pair, the upper switch of a switch pair in FIG. 1 has a suffix U, and the lower switch has a suffix D. For example, the switch pair located fourth from the right and second from the bottom is denoted as SW(3,2), and the upper switch of the switch pair is denoted as SW(3,2)U, and the lower switch is denoted as SW(3,2)D.

In addition, the switch pairs in a predetermined column are denoted collectively without the second numeral; for example, the switch pairs in the fourth column from the right, including SW(3,1), SW(3,2), and SW(3,3), are denoted collectively as SW(3). Further, the upper switches of all the switch pairs in a predetermined column are denoted collectively without the second numeral; for example, the upper switches of the switch pairs in the fourth column from the right, including SW(3,1)U, SW(3,2)U, and SW(3,3)U, are denoted collectively as SW(3)U. The same nomenclature applies to the lower switches.

The configuration of switches for each bit will be explained.

There are nine switch pairs, that is, SW(5,1) to SW(5,9), which operate in accordance with Bit 5 (MSB) of the 6-bit display data, and each pair includes two switches U and D.

$V_0$ is inputted to one of the terminals of SW(5,1)D, and $V_{32}$ is inputted to one of the terminals of SW(5,1)U. The other terminals of SW(5,1)D and SW(5,1)U are connected together to form a common terminal. $V_4$ is inputted to one of the terminals of SW(5,2)D, and $V_{36}$ is inputted to one of the terminals of SW(5,2)U. The other terminals of SW(5, 2)D and SW(5,2)U are connected together to form a common terminal. Similarly, $V_{4(n-1)}$ is inputted to one of the terminals of SW(5,n)D, $V_{4(n-1)+32}$ is inputted to one of the terminals of SW(5,n)U, and the other terminals of SW(5,n)D and SW(5,n)U are connected together to form a common terminal, where n=1, 2, . . . , and 9.

These switch pairs SW(5) operate interactively; when Bit 5 is "0", the lower switches SW(5)D are closed (turned on), and conversely, the upper switches SW(5)U are opened (turned off). On the other hand, when Bit 5 is "1", the lower switches SW(5)D are opened (turned off), and conversely, the upper switches SW(5)U are closed (turned on).

Five switch pairs, that is, SW(4, 1) to SW(4, 5), operate in accordance with Bit 4, and similarly to the above case, each pair includes two switches U and D.

The common terminal of SW(5,1) is connected to one of the terminals of SW(4, 1)D, and the common terminal of SW(5,5) is connected to one of the terminals of SW(4, 1)U. The other terminals of SW(4, 1)D and SW(4, 1)U are connected together to form a common terminal. Similarly, the common terminal of SW(5,m) is connected to one of the terminals of SW(4, m)D, the common terminal of SW(5, m+4) is connected to one of the terminals of SW(4, m)U, and the other terminals of SW(4, m)D and SW(4, m)U are connected together to form a common terminal, where m=1, 2, . . . , and 5.

These switch pairs SW(4) operate interactively; when Bit 4 is "0", the lower switches SW(4)D are closed (turned on), and conversely, the upper switches SW(4)U are opened (turned off). On the other hand, when Bit 4 is "1", the lower switches SW(4)D are opened (turned off), and conversely, the upper switches SW(4)U are closed (turned on).

Next, three switch pairs, that is, SW(3,1) to SW(3,3), operate in accordance with Bit 3, and each pair includes two switches U and D.

The common terminal of SW(4,1) is connected to one of the terminals of SW(3,1)D, and the common terminal of SW(4,3) is connected to one of the terminals of SW (3,1)U. The other terminals of SW(3,1)D and SW(3,1)U are connected together to form a common terminal. Similarly, the common terminal of SW(4,k) is connected to one of the terminals of SWI(4,k)D, the common terminal of SWI(4,k+2) is connected to one of the terminals of SW(3,k)U, and the other terminals of SW(3,k)D and SW(3,k)U are connected together to form a common terminal, where k=1, 2, and 3.

These switch pairs SW(3) operate interactively; when Bit 3 is "0", the lower switches SW(3)D are closed (turned on), and conversely, the upper switches: SW(3)U are opened (turned off). On the other hand, when Bit 3 is "1", the lower switches SW(3)D are opened (turned off), and conversely, the upper switches SW(3)U are closed (turned on).

Next, two switch pairs, SW(2,1) and SW(2,2), operate in accordance with Bit 2, and each pair similarly includes two switches U and D.

The common terminal of SW(3,1) is connected to one of the terminals of SW(2,1)D, and the common terminal of SW(3,2) is connected to one of the terminals of SW(2,1)U. The other terminals of SW(2,1)D and SW(2,1)U are connected together to form a common terminal.

Similarly, the common terminal of SW(3,2) is connected to one of the terminals of SW(2,2)D, and the common terminal of SW(3,3) is connected to one of the terminals of SW(2,2)U. The other terminals of SW(2,2)D and SW(2,2)U are connected together to form a common terminal.

In other words, the common terminal of SW(3,j) is connected to one of the terminals of SW(2,j)D, the common terminal of SW(3,j+1) is connected to one of the terminals of SW(2,j)U, and the other terminals of SW(2,j)D and SW(2,j)U are connected together to form a common terminal, where j=1, 2.

These switch pairs SW(2) operate interactively; when Bit 2 is "0", the lower switches SW(2)D are closed (turned on), and conversely, the upper switches SW(2)U are opened (turned off). On the other hand, when Bit 2 is "1", the lower switches SW(2)D are opened (turned off), and conversely, the upper switches SW(2)U are closed (turned on).

Next, one switch pair, SW(1,1), operates in accordance with Bit 1, and the switch pair similarly includes two switches U and D.

The common terminal of SW(2,1) is connected to one of the terminals of SW(1,1)D, and the common terminal of SW(2,2) is connected to one of the terminals of SW(1,1)U. The other terminals of SW(1,1)D and SW(1,1)U are connected together to form a common terminal, which is further connected to an input terminal IN of the voltage follower circuit 17.

The switch pair SW(1,1) operates interactively; when Bit 1 is "0", the lower switch SW(1,1)D is closed (turned on), and conversely, the upper switch SW(1,1)U is opened (turned off). On the other hand, when Bit 1 is "1", the lower switch SW(1,1)D is opened (turned off), and conversely, the upper switch SW(1,1)U is closed (turned on).

Lastly, one switch pair, SW(0,1), operates in accordance with Bit 0 (LSB), and the switch pair similarly includes two switches U and D.

The common terminal of SW(2,1) is connected to one of the terminals of SW(0,1)D, and the common terminal of SW(2,2) is connected to one of the terminals of SW (0,1)U. The other terminals of SW(0,1)D and SW(0,1)U are connected together to form a common terminal, which is further connected to an input terminal $IN_2$ of the voltage follower circuit 17.

The switch pair SW(0,1) operates interactively; when Bit 0 is "0", the lower switch SW(0,1)D is closed (turned on), and conversely, the upper switch SW(0,1)U is opened (turned off). On the other hand, when Bit 0 is "1", the lower switch SW(0,1)D is opened (turned off), and conversely, the upper switch SW(0,1)U is closed (turned on).

The common terminal of SW(2,1) is connected to one of the terminals of SW(1,1)D and SW(0,1)D, and it is also connected to an input terminal $IN_3$ of the voltage follower circuit 17.

FIG. 4 is a table presenting the operation is of the selector circuit 16. The table shows a relationship among the 6-bit display data, the outputs of the selector circuit 16 (voltages inputted to the input terminals $IN_1$, $IN_2$, and $IN_3$), and an output voltage $V_{out}$ (described later) of the voltage follower circuit 17.

As shown in FIG. 4, the outputs of the selector circuit 16, that is, input voltages ($VIN_3$, $VIN_2$, $VIN_1$) supplied to the input terminals ($IN_3$, $IN_2$, $IN_1$) of the voltage follower circuit 17, are classified according to the lower two bits (Bit 1, Bit 0: output voltage selecting bits) of the 6-bit display data, as follows: when the lower two bits are (0,0), the input voltages ($V_{4a}$, $V_{4a}$, $V_{4a}$) are provided to the input terminals ($IN_3$, $IN_2$, $IN_1$); similarly, when the lower two bits are (0,1), (1,0), and (1,1), the input voltages ($V_{4a}$, $V_{4(a+1)}$, $V_{4a}$) ($V_{4a}$, $V_{4a}$, $V_{4(a+1)}$) and ($V_{4a}$, $V_{4(a+1)}$, $V_{4(a+1)}$) are provided to the input terminals ($IN_3$, $IN_2$, $IN_1$), respectively. Here, a denotes the value represented by the upper four bits (Bit 5 to Bit 2: reference voltage selecting bits) of the display data, and in this case, a=0, 1, . . . , and 15.

Next, the voltage follower circuit 17 will be explained.

As shown in FIG. 4, the voltage follower circuit 17 receives the input voltages ($VIN_3$, $VIN_2$, $VIN_1$) via the three input terminals ($IN_3$, $IN_2$, $IN_1$) and provides the output voltage $V_{out}$ which satisfies the following relationship.

$$V_{out}=(VIN_3+VIN_2+VIN_1 \times 2)/4$$

Here, as shown above, the input voltage to the input terminal $IN_1$ is weighted double.

Therefore, the input/output relationship of the voltage follower circuit 17 can be defined as follows: The output voltage $V_{out}$ is provided as follows, according to the input voltages ($VIN_3$, $VIN_2$, $VIN_1$).

$$(V_{4a}, V_{4a}, V_{4a}); V_{out}=V_{4a} \qquad (1)$$

$$(V_{4a}, V_{4(a-1)}, V_{4a}); V_{out}=[V_{4a}\times 3+V_{4(a+1)}]/4 \qquad (2)$$

$$(V_{4a}, V_{4a}, V_{4(a+1)}); V_{out}=[V_{4a}\times 2+V_{4(a+1)}\times 2]/4 \qquad (3)$$

$$(V_{4a}, V_{4(a+1)}, V_{4(a+1)}); V_{out}=[V_{4a}+V_{4(a+1)}\times 3]/4 \qquad (4)$$

Additionally, if the input voltages are set to ($V_{4(a+1)}$, $V_{4(a+1)}$, $V_{4(a-1)}$), the output voltage would be defined as follows:

$$V_{out}=V_{4(a+1)} \quad (5)$$

These equations represent that the voltage follower circuit 17 can generate voltages having the voltage levels which equally divide the interval between the reference voltages $V_{4a}$ and $V_{4(a+1)}$ selected according to the reference voltage selecting bits of the display data among the reference voltages generated by the reference voltage generating circuit 18 (FIG. 1) into four by linear interpolation, to interpolate the interval between the reference voltages $V_{4a}$ and $V_{4(a+1)}$. For example, if a=0, the voltage follower circuit 17 can generate three voltages $V_1$, $V_2$, and $V_3$ [corresponding to the equations (2), (3), and (4)], as the voltages which divide the interval between $V_0$ [corresponding to the equation (1)] and $V_4$ [corresponding to the equation (5)] into four. Then, the voltage follower circuit 17 outputs one of the voltages $V_0$, $V_1$, $V_2$, and $V_3$ as the output voltage $V_{out}$, in accordance with the combination of the reference voltages supplied from the output voltage selector circuit 16b as the input voltages (VIN$_3$, VIN$_2$, VIN$_1$).

In this manner, the voltage follower circuit 17 can generate three voltages (interpolation voltages) for each of the 16 intervals [between $V_{4(a+1)}$ and $V_{4a}$ (a=0, 1, . . . , 15)] between the reference voltages $V_{64}$ and $V_0$, to interpolate the respective intervals. With this interpolation, 64 analog voltages required for a 64-level gradation display can be provided in accordance with the 6-bit display data (four reference voltage selecting bits and two output voltage selecting bits), from the 17 voltage levels generated by the resistance division between the reference voltages $V_{64}$ and $V_0$.

The following description will explain a voltage follower circuit (output voltage generating means) 17A, an example of the voltage follower circuit 17 to output the output voltage $V_{out}$.

Figure 2:
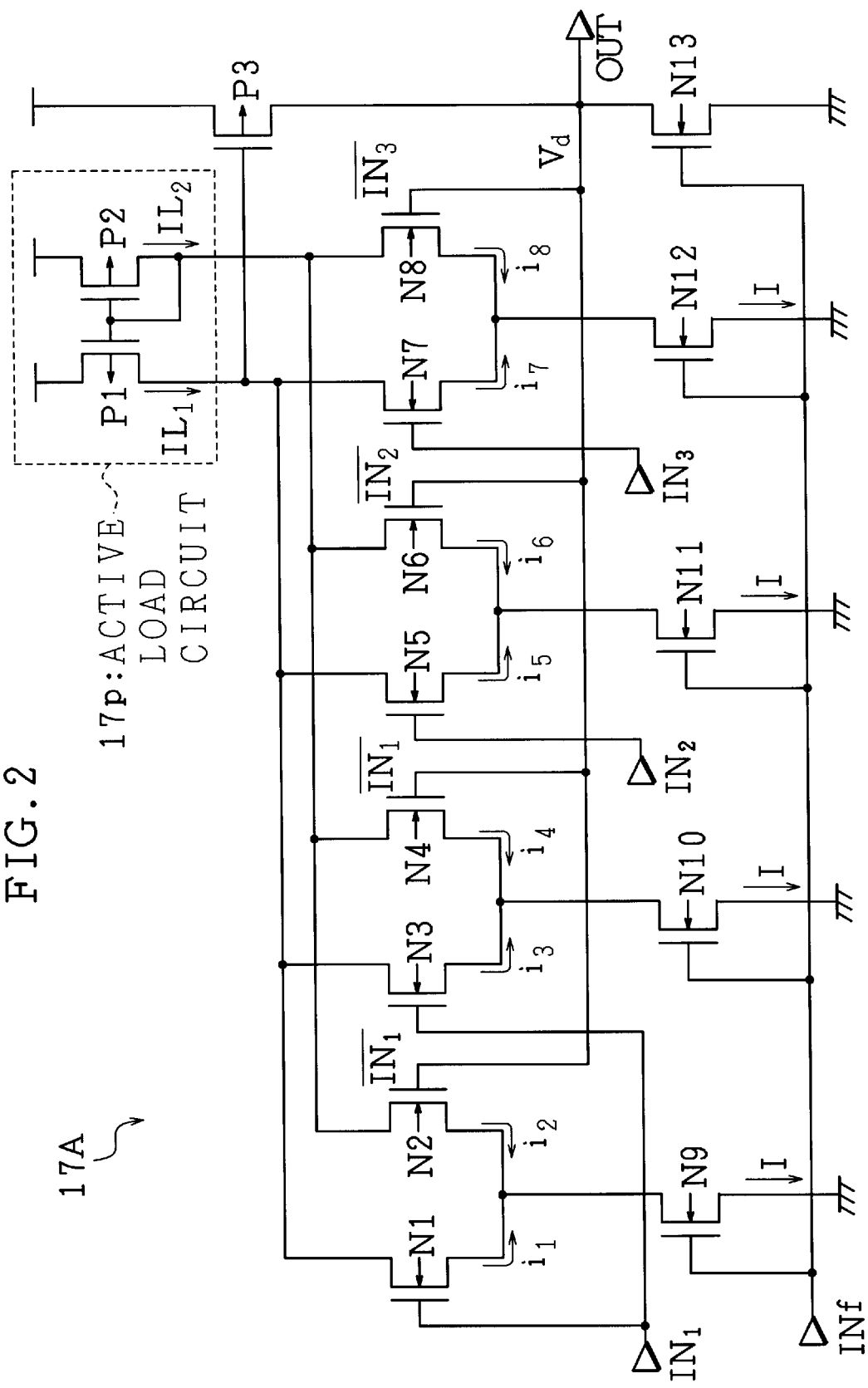
FIG. 2 is a circuit diagram showing an example of a voltage follower circuit in the DA converter shown in FIG. 1.

As shown in FIG. 2, in the voltage follower circuit 17A, input terminals IN$_1$ (common for two differential pairs), IN$_2$, and IN$_3$ are inphase input terminals. Input terminals /IN$_1$ (common for two differential pairs), /IN$_2$, and /IN$_3$ are anti-phase input terminals, which are connected together to be in common.

Transistors N1 and N2, N3 and N4, N5 and N6, and N7 and N8 form differential pairs respectively, and the respective sources of the paired transistors are connected and grounded via transistors N9 to N12 which operate as constant current sources.

The transistors N9 to N12 supply an operating current to the respective differential pairs composed of two transistors, and a common current is sent to the transistors N9 to N12 by an input voltage VInf from an input terminal Inf.

The transistors N1, N3, N5 and N7 are connected together at their drains and further to the drain of a P channel MOS transistor P1 which constitutes a current mirror circuit. Meanwhile, the transistors N2, N4, N6 and N8 are connected together at their drains and further to the drain of a P channel MOS transistor P2 which constitutes the current mirror circuit and has a diode connection. The sources of the transistors P1 and P2 are connected to power supplies.

There is also provided an output terminal OUT, which is composed of a P channel MOS transistor P3 and an N channel MOS transistor N13 which operates as a constant current source to supply an operating current to the P channel MOS transistor P3.

The drain of the transistor P3 is grounded via the transistor N13, and the source of the transistor P3 is connected to a power supply. The gates of the transistors N2, N4, N6, and N8 and the drain of the transistor P3 are connected to form the output terminal OUT. The gate of the transistor P3 is connected to the drain of the transistor P1. The gate of the transistor N13 is common to the gates of the transistors N9 to N12.

Here, the amount of a current flowing each of the N channel MOS transistors N9 to N13 which operate as constant current sources is the same, and the current will be denoted as I. Further, the N channel MOS transistors N1 to N8, which form the differential pairs, have similar properties, and share an identical transmission conductance gm.

Incidentally, with the structure that respective inphase input terminals of the differential pair composed of the transistors N1, N2, and N9 and the differential pair composed of the transistors N3, N4, and N1 are connected to the common input terminal IN$_1$, the reference voltage inputted to the input terminal IN$_1$ (the input voltage VIN$_1$) is weighted double, compared with the reference voltages inputted to the input terminals IN$_2$ and IN$_3$ (the input voltages VIN$_2$ and VIN$_3$).

Here, for convenience in the explanation of the operation, a structure where an output circuit (composed of the transistors P3 and N13) is separated from the voltage follower circuit 17A will be explained first.

When the input voltage VIN is supplied to the input terminal IN$_1$ (common for two differential pairs) and a common voltage Vd is supplied to the input terminal /IN$_1$ (common for two differential pairs), a drain current $i_1$ (the same can be said for $i_3$) of the N channel MOS transistor N1 (same as N3) and a drain current $i_2$ (same as $i_4$) of the N channel MOS transistor N2 (same as N4) satisfy the following equations:

$$i_1 = i_3 = (I/2) + gm(Vd - VIN_1)$$
$$= (I/2) + gm \cdot va$$
$$i_2 = i_4 = (I/2) - gm(Vd - VIN_1)$$
$$= (I/2) - gm \cdot \Delta va$$

where $\Delta va = Vd - VIN_1$.

Similarly, when the input voltage VIN$_2$ is supplied to the input terminal IN$_2$, and the common voltage Vd is supplied to the input terminal /IN$_2$, a drain current $i_5$ of the N channel MOS transistor N5 and a drain current $i_6$ of the N channel MOS transistor N6 satisfy the following equations:

$$i_5=(I/2)+gm(Vd-VIN_2)=(I/2)+gm\cdot\Delta vb$$
$$i_6=(I/2)-gm(Vd-VIN_2)=(I/2)-gm\cdot\Delta vb$$

where $\Delta vb = Vd - VIN_2$.

Similarly, when the input voltage VIN$_3$ is supplied to the input terminal IN$_3$, and the common voltage Vd is supplied to the input terminal /IN$_3$, a drain current $i_7$ of the N channel MOS transistor N7 and a drain current $i_8$ of the N channel MOS transistor N8 satisfy the following equations:

$$i_7=(I/2)+gm(Vd-VIN_3)=(I/2)+gm\cdot\Delta vc$$
$$i_8=(I/2)-gm(Vd-VIN_3)=(I/2)-gm\cdot\Delta vc$$

where $\Delta vc = Vd - VIN_3$.

Considering these equations, a drain current IL$_1$ of the P channel MOS transistor P1 and a drain current IL$_2$ of the P channel MOS transistor P2, both of which constitute a active load circuit 17p, are given by the following equations:

$$IL_1 = i_1 + i_3 + i_5 + i_7 \quad (A)$$
$$= 2I + gm(\Delta va + \Delta va + \Delta vb + \Delta vc)$$

$$IL_2 = i_2 + i_4 + i_6 + i_8 \quad (B)$$
$$= 2I - gm(\Delta va + \Delta va + \Delta vb + \Delta vc)$$

From these equations (A) and (B), it is understood that $IL_1$ and $IL_2$ are the sums of results of the differential amplification of the four differential pairs. Since the P channel MOS transistors P1 and P2 constituting the active load circuit 17p constitute the current mirror circuit, the two load currents $IL_1$ and $IL_2$ are equal to each other in an operation range where the amplifier circuit performs a normal amplifying operation.

Therefore, if $IL_1=IL_2$ in the above equations (A) and (B), the following equation will be obtained.

$$\Delta va + \Delta va + \Delta vb + \Delta vc = 0$$

That is:

$$(Vd-VIN_1)+(Vd-VIN_1)+(Vd-VIN_2)+(Vd-VIN_3)=0 \quad (C)$$

This equation gives a result of an application of an imaginary short relationship of a normal OP-amplifier circuit to a circuit of the present invention. The relationship is based on the assumption that the differential amplifier circuit shown in FIG. 2 are specified in advance to operate in a state where a proper bias is given and to be in a normal amplifying operation range where a signal of a small amplitude is amplified in a vicinity of its operation point.

Therefore, from the above equation (C), the following equation will be obtained:

$$Vd=(VIN_1 \times 2+VIN_2+VIN_3)/4.$$

This equation represents that the input voltage Vd supplied to the common anti-phase input terminals gives the weighted mean value of the input voltages supplied to the three inphase input terminals $IN_1$, $IN_2$, and $IN_3$, with the input voltage supplied to IN, weighted double.

The voltage follower circuit 17A shown in FIG. 2 feeds back the output signals of the differential amplifier circuits to the common anti-phase input terminals $/IN_1$, $/IN_2$, and $/IN_3$ of the differential amplifier circuits. Therefore, the output voltage $V_{out}$ of the voltage follower circuit 17A shown in FIG. 2 satisfies the following equation:

$$V_{out}=(VIN_1 \times 2+VIN_2+VIN_3)/4 \quad (D)$$

This equation (D) shows that the weighted mean value of the three input voltages $VIN_1$, $VIN_2$, and $VIN_3$ is given, with one of the input voltages supplied to the three inphase input terminals $IN_1$, $IN_2$, and $IN_3$ weighted double.

Next, the following description will explain a voltage follower circuit (output voltage generating means) 17B, another example of the voltage follower circuit 17 to output the output voltage $V_{out}$.

Figure 3:
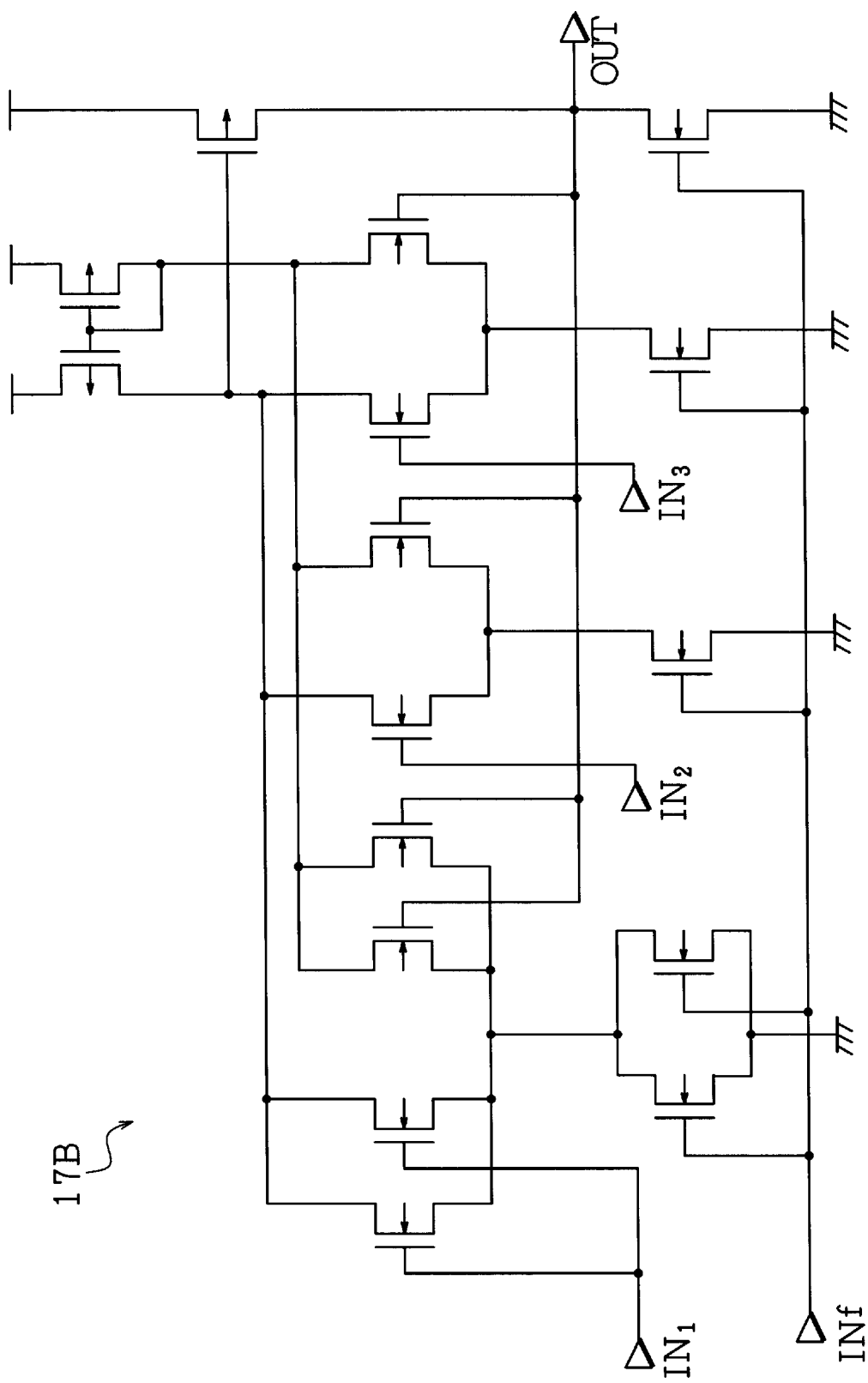
FIG. 3 is a circuit diagram showing another example of the voltage follower circuit in the DA converter shown in FIG. 1.

As shown in FIG. 3, the voltage follower circuit 17B is structured such that the two differential pairs (transistors N1 and N2, N3 and N4) which assign a double weight and the two constant current sources (transistors N9 and N10) in the voltage follower circuit 17A are combined respectively. Therefore, the operation of the voltage follower circuit 17B will not be explained here as it is basically the same as that of the voltage follower circuit 17A.

As has been discussed, by inputting a combination of the reference voltages (one or two adjacent values) corresponding to the display data shown in FIG. 4 into the voltage follower circuits 17A and 17B shown in FIGS. 2 and 3, the voltage follower circuits 17A and 17B can interpolate or generate a voltage given by either one of the equations (1) through (4), and output the voltage as the output voltage $V_{out}$.

That is, the voltage follower circuit 17 includes a circuit which assigns a weight to input signals, and is structured such that, when a plurality of different voltages are inputted simultaneously to a plurality of inphase input terminals, the weighted mean value of different signals is outputted from an output terminal, and when the same voltage is inputted simultaneously to a plurality of inphase input terminals, the voltage having the same value with the inputted voltage is outputted from an output terminal.

Thus, the DA converter 10 incorporating the voltage follower circuit 17 can output voltages generated by interpolation as well as the voltages generated by the reference voltage generating circuit 18, allowing a substantial reduction in the number of voltages generated by the reference voltage generating circuit 18.

Consequently, the number of resistor elements constituting the reference voltage generating circuit 18 can be reduced substantially. Further, since the number of voltages provided by the reference voltage generating circuit 18 is reduced, the number of switches in the selector circuit 16 for selecting the voltages generated by the reference voltage generating circuit 18 can also be greatly reduced.

Furthermore, since the selector circuit 16 is provided to each liquid crystal driving output terminal, the reduction in the number of circuits in the selector circuit 16 permits great reductions in the chip size of liquid crystal driving circuits and in manufacturing cost. Especially, in a liquid crystal driving circuit for color display, a liquid crystal driving output terminal is required for each of the display data for three primary colors R, G, and B. Therefore, the reduction in the size of the selector circuit 16, which occupies a large size in a liquid crystal driving circuit, permits a great reduction in chip size and substantially contributes to the resulting cost reduction. In addition, a smaller IC for use in a liquid crystal driving circuit allows a liquid crystal display device incorporating the IC to be greatly reduced in size.

Therefore, the present invention is greatly effective in realizing high quality display devices with higher resolution and more gradation display capabilities using increasingly large number of pixels, as well as more compact display devices with enhanced portability.

Incidentally, the applicant of the present invention proposed a DA converter which is structured such that two reference voltages having adjacent voltage levels are selected to generate a voltage having the weighted mean value of the reference voltages for interpolation, resulting in the reduction in the numbers of resistor elements and switches, in Japanese Unexamined Patent Publication No. 2000-183747/2000 (Tokukai 2000-183747, published on Jun. 30, 2000), titled "DA Converter and Liquid Crystal Driving Device Incorporating the Same". More specifically, as shown in FIG. 12, a DA converter 110 includes a reference voltage generating circuit 118 which is a resistance type potential divider circuit generating voltages for every two voltage levels, and a selector circuit 116 selecting one or two adjacent reference voltages, and a voltage follower circuit 117 which generates a voltage having the same value as the reference voltage or having a weighted mean value of the two reference voltages for output.

Figure 12:
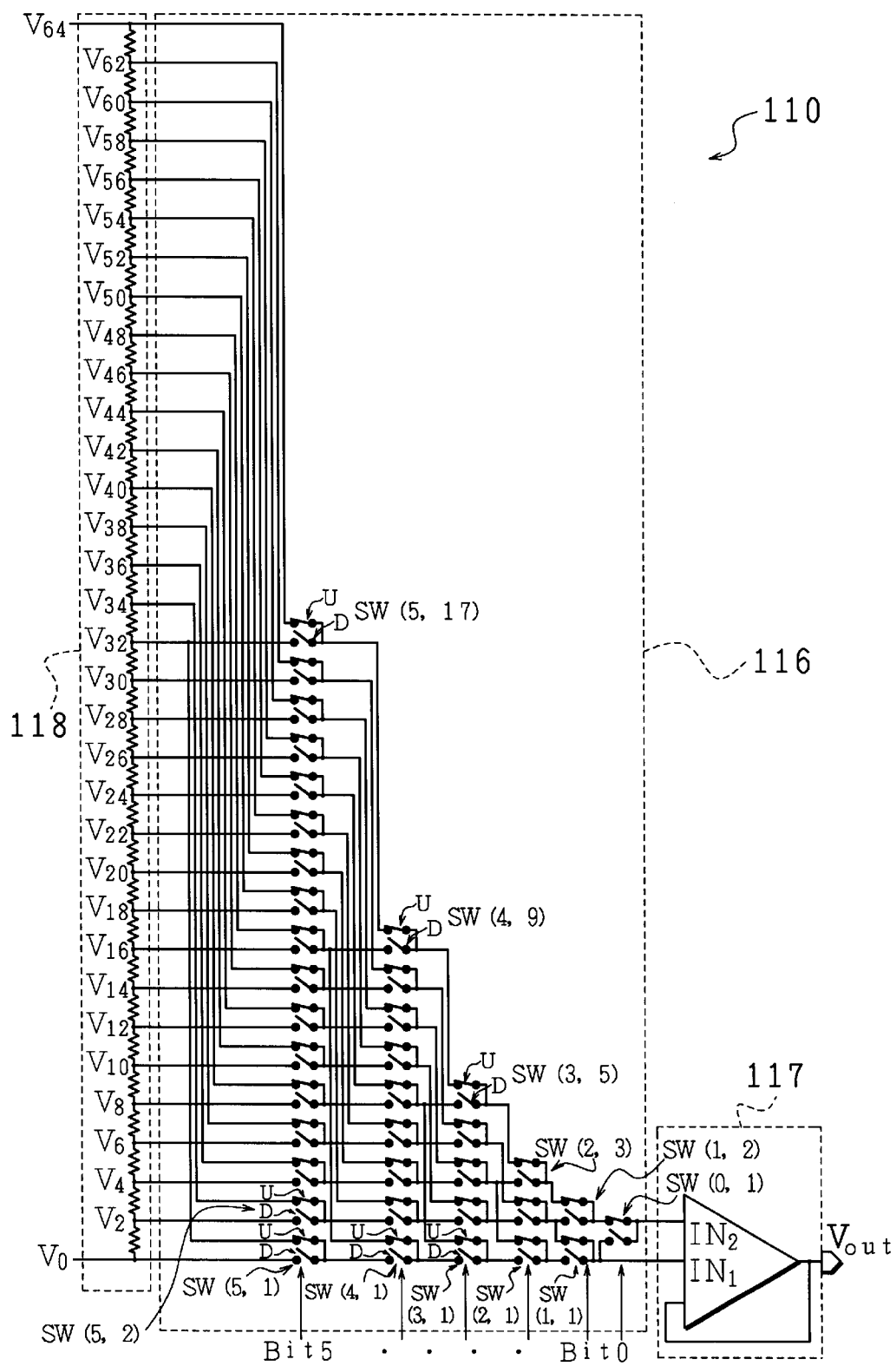
FIG. 12 is a circuit diagram showing a structure of a conventional DA converter.

With the structure of the DA converter 10 (FIG. 1) in accordance with the present embodiment, the number of reference voltages required to be generated is halved also in the DA converter 110 (FIG. 12). Consequently, the number of resistor elements in the reference voltage generating circuit 118 and the number of switches in the selector circuit 116 can be reduced almost by half.

The present embodiment is not intended to limit the scope of the present invention, and it is possible to make various alternations on the present embodiment within the scope of the present invention.

For example, in the present embodiment, the DA converter 10 is explained such that it converts N-bit digital signals to $2^N$ analog signals, and it includes the voltage follower circuit 17 having a two-hold ($2^1$) weighting circuit so as to generate $2^N$ analog levels by generating levels which interpolate the respective intervals between $2^{(N-1)}+1$ analog levels based on the $2^{(N-1)}+1$ analog signals.

However, by having a $2^m$ (m=1, 2, ...) weighting circuit in the voltage follower circuit 17, the DA converter 10 can generate $2^N$ analog levels by generating levels which interpolate the respective intervals, between two adjacent voltage levels of $2^{[N-(m+1)]}+1$ analog levels based on the $2^{[N-(m+1)]}+1$ analog signals. For example, by adding a four-fold ($2^2$) weighting circuit and a two-fold ($2^1$) weighting circuit, it becomes possible to realize a DA converter converting N-bit digital signals to $2^N$ analog signals, which can generate $2^N$ analog levels by generating levels which interpolate the respective intervals between $2^{(N-3)}+1$ analog levels based on the $2^{(N-3)}+1$ analog signals. Furthermore, it is possible that the voltage follower circuit 17 is structured to have an eight-fold ($2^3$) weighting circuit.

As obvious in the circuit diagrams shown in FIGS. 2 and 3, the structure of Q-fold weight (Q=2, 3, ...) to the voltage follower circuit 17 is easily realized by placing Q sets of corresponding to differential pairs (transistors N1 and N2, N3 and N4 in FIG. 2) and constant current sources (transistors N9 and N10 in FIG. 2) in parallel.

Further, a method for interpolation in the voltage follower circuit 17 is not limited to linear interpolation. That is, it is possible to easily derive a method for generating interpolation voltages other than linear interpolation from the above operation principle, by changing the weighting applied to an input terminal.

In the present embodiment, explanations have been given for the case where the DA converter 10 which performs interpolation is incorporated into a liquid crystal driving circuit. The DA converter 10 is also effective for other semiconductor devices and other types of display driving devices.

Finally, the present invention can be structured as will be described.

A DA converter in accordance with the present invention may be arranged as follows. The DA converter which generates different reference voltages and converts N-bit digital signals to $2^N$ analog signals based on the corresponding reference voltages may include:

reference voltage generating means (the reference voltage generating circuit 18) for generating $2^{[N-(m+1)]}+1$ (m=1, 2, ... ) reference voltages;

selecting means (the selector circuit 16) for selecting a combination of the reference voltages which corresponds to an inputted digital signal from the $2^{[N-(m+1)]}+1$ reference voltages when receiving the digital signal, and providing respective reference voltages of the selected combination; and output means (the voltage follower circuit 17) for providing a weighted mean value of the reference voltages inputted by the selecting means, including means for assigning a $2^m$ weight to the inputted reference voltages.

The DA converter converting N-bit digital signals to $2^N$ analog signals based on the reference voltages may include:

reference voltage generating means (the reference voltage generating circuit 18) for generating $2^{(N-2)}+1$ different reference voltages;

selecting means (the selector circuit 16) for selecting a combination of the reference voltages which corresponds to an inputted digital signal from the $2^{(N-2)}+1$ reference voltages when receiving the digital signal, and providing respective reference voltages of the selected combination; and output means (the voltage follower circuit 17) for providing a weighted mean value of the reference voltages inputted by the selecting means, including weighting means for two-hold weighting the inputted reference voltages.

The DA converter may be arranged such that the reference voltage generating means is a resistance type potential divider circuit where a plurality of resistor elements are connected one another to generate reference voltages from the connected sections between the resistor elements.

The DA converter is arranged so as to include selecting means (the selector circuit 16) for selecting a combination of voltages corresponding to an inputted digital signal and providing the respective reference voltages of the selected combination, and weighting means (the voltage follower circuit 17) for Q-fold weighting the reference voltages wherein the reference voltages provided by the selecting means are supplied to differential input terminals of a plurality of differential amplifier circuits, and a plurality of the input terminals within the differential pairs are commonly connected.

A liquid crystal display device driving device in accordance with the present invention may be arranged so as to include the DA converter.

With the DA converter in accordance with the present invention, despite a possible increase in the number of voltages required to provide a display with more gradation levels, large increases in the number of circuit composing elements can be avoided. Therefore, a liquid crystal driving device incorporating the foregoing DA converter is suitable as a multiple-gradation driver for a liquid crystal television set and the like. The foregoing DA converter can be applied to ICs composed of CMOS, including liquid crystal driving IC.

As has been discussed, a DA converter of the present invention, for converting digital signals to analog signals by generating reference voltages having different voltage levels and providing output voltages based on the reference voltages according to the digital signals, may be structured so as to include:

reference voltage generating means for generating the reference voltages;

reference voltage selecting means for selecting two adjacent reference voltages so as to include the voltage level of an output voltage between the voltage levels of the two reference voltages;

output voltage selecting means for selecting the voltage level of the output voltage from a plurality of voltage levels predetermined between the voltage levels of the two reference voltages; and output voltage generating means for producing a voltage having the voltage level selected by the output voltage selecting means as the output voltage, based on the two reference voltages.

The DA converter converts digital signals to analog signals by, for example, generating mutually different reference voltages through division by resistor elements and turning on/off switches according to N-bit digital signals to provide $2^N$ output voltages based on the reference voltages.

In such an arrangement, the reference voltage selecting means selects two reference voltages having adjacent voltage levels from the reference voltages generated by the reference voltage generating means, and the output voltage generating means generates a voltage whose voltage level lies between the two reference voltages (a interpolation voltage) as an output voltage, based on the two reference voltages. Further, between the two reference voltages, there are a plurality of predetermined voltage levels which can be selected as an output voltage, and the output voltage selecting means selects one of the plurality of voltage levels, and the output voltage generating means determines the output voltage to be generated.

In this manner, the DA converter generates interpolation voltages which have voltage levels not generated by the reference voltage generating means, based on the reference voltages generated by the reference voltage generating means. As a result, the DA converter can output voltages not generated by the reference voltage generating means (interpolation voltages) as well as the voltages generated by the reference voltage generating means (reference voltages) as the output voltages. Further, in the DA converter, the voltage level of an interpolation voltage can be selected from a plurality of voltage levels predetermined between adjacent reference voltages.

Consequently, in the DA converter, a part of the voltage levels required to provide an output voltage can be generated by interpolation, permitting a significant reduction in the number of voltages generated by the reference voltage generating means less than the number required. Therefore, the number of elements, for example, resistor elements in the reference voltage generating means can be greatly reduced in comparison with conventional technology. Furthermore, since the number of reference voltages generated by the reference voltage generating means is relatively small, the number of elements, for example, switches for turning on/off in the reference voltage selecting means for selecting reference voltages can be greatly reduced in comparison with conventional technology.

Therefore, despite a possible increase in the number of voltages required, large increases in the number of circuit composing elements such as resistor elements and switches can be avoided, thus preventing an increase in manufacturing cost and permitting the production of more compact devices.

The DA converter of the present invention may be arranged so as to include the reference voltage generating means which generates the reference voltages of $2^A+1$ (A=1, 2, . . . ) different levels, and each of the digital signals includes reference voltage selecting A bits which designate the two reference voltages to the reference voltage selecting means.

In such an arrangement, A bits of the digital signal are used as the reference voltage selecting bits to select two reference voltages with adjacent voltage levels generated by the reference voltage generating means. Thus, $2^A$ pairs of the two reference voltages can be designated by A reference voltage selecting bits.

With this arrangement, the reference voltage generating means generate $2^A+1$ (A=1, 2, . . . ) reference voltages, and $2^A$ pairs of the two reference voltages can be designated to the reference voltage selecting means by A bits of the digital signal (the reference voltage selecting bits). Therefore, the reference voltage generating means and the digital signals can be used with efficiency.

The DA converter of the present invention may be arranged such that, the output voltage generating means generates the output voltage by linear interpolation based on the two reference voltages.

With this arrangement, the output voltage generating means also generates a voltage with a voltage level other than those of the reference voltages, by linear interpolation based on the two reference voltages selected by the reference voltage selecting means. Since the operation for the interpolation is simple, the output voltage generating means can be easily provided. In addition, when applying the DA converter to a liquid crystal driving device, linear interpolation is suitable to generate a voltage level corresponding to the gradation level.

The DA converter of the present invention may be arranged such that, each of the digital signals includes B (B=2, 3, . . . ) output voltage selecting bits which designate the voltage level of the output voltage to the output voltage selecting means, and the output voltage generating means includes means for assigning a $2^C$ (C=1, 2, . . . , B−1) weight to either one of the two reference voltages.

With this arrangement, B bits of the digital signal are used as output voltage selecting bits to designate the voltage level of the output voltage. Thus, $2^B$ output voltages can be designated by B output voltage selecting bits. Therefore, even if one of the $2^B$ output voltages is assigned for a case where a voltage identical to either one of the two reference voltages is to be provided as the output voltage, $2^B-1$ interpolation voltages can be designated from a plurality of voltage levels predetermined between the two reference voltage levels. That is, $2^B-1$ interpolation voltages are available to be selected between the two reference voltages.

In addition, since the output voltage generating means includes means for assigning a $2^C$ weight to either one of the two reference voltages, $2^B-1$ interpolation voltages can be generated between the two reference voltages by calculating a weighted mean value of the two reference voltages.

For example, two output voltage selecting bits can designate four voltages generated by the output voltage generating means. When the reference voltages are $V_0$ and $V_4$, the output voltage generating means can assign a double weight to either $V_0$ or $V_4$ by the weighting means, so the weighted mean value of the reference voltages $V_0$ and $V_4$ is calculated, and $(V_0 \times 3+V_4)/4=V_1$, $(V_0 \times 2+V_4 \times 2)/4=V_2$, $(V_0+V_4 \times 3)/4=V_3$, are generated between the reference voltages $V_0$ and $V_4$. That is, three interpolation voltages $V_1$, $V_2$, and $V_3$ can be generated as the voltages which equally divide the interval between the reference voltages $V_0$ and $V_4$ into four.

Thus, it is possible to designate $2^B$ voltage levels for the output voltage to the output voltage selecting means by B bits (output voltage selecting bits) of the digital signal, and to generate $2^B$ output voltages by the output voltage generating means by calculating a weighted mean value of the two reference voltages.

Therefore, in the DA converter, the output voltage selecting means and the digital signals can be used with efficiency. Since the operation for the interpolation is simple, the output voltage generating means can be easily provided. In addition, when applying the DA converter to a liquid crystal driving device, linear interpolation is suitable to generate a voltage level corresponding to the gradation level.

The DA converter of the present invention, may be arranged such that each of the digital signals includes the reference voltage selecting bits and the output voltage selecting bits, and the output voltage selecting bits are made up of two bits.

Supposing that each of the digital signals is made up of A+B=N bits, A becomes N−2, as B=2. In this case, the DA converter is a DA converter converting N-bit digital signals to $2^N$ analog signals, and the reference voltage generating means generates reference voltages having $2^{N-2}+1$ voltage levels. The reference voltage selecting means selects two reference voltages having adjacent voltage levels in accordance with the N−2 bits of a digital signal. The reference voltage selecting means also selects one of the three interpolation voltages, which are calculated as $2^2-1=3$ (one of the $2^2$ voltages is assigned for a case where a voltage identical to either one of the two reference voltages is outputted) and predetermined in the interval between the voltage levels of the two reference voltages, in accordance with the two bits of the digital signal. Then, the output voltage generating means assigns a double weight to either one of the two reference voltages to calculate a weighted mean value based on the two reference voltages, and generates the interpolation voltage.

For example, in the case of a DA converter which is provided in a liquid crystal driving device which displays 64 gradation levels in accordance with 6-bit digital signals, the reference voltage generating means generates 17 voltages ($V_0$, $V_4$, $V_8$, ..., $V_{60}$, $V_{64}$) corresponding to every four gradation levels, and three interpolation voltages can be generated in the respective 16 intervals [between $V_{4(a+1)}$ and $V_{4a}$].

Consequently, in the DA converter, a part of the voltage levels required to provide an output voltage can be generated by interpolation, permitting the reduction in the number of voltages generated by the reference voltage generating means less than the number required. Therefore, the numbers of elements, for example, resistor elements in the reference voltage generating means, and switches in the reference voltage selecting means can be greatly reduced in comparison with conventional technology.

The DA converter of the present invention may be arranged such that, the reference voltage generating means is a resistance type potential divider circuit where a plurality of resistor elements are connected one another to generate reference voltages from the connected sections between these resistor elements.

With this arrangement, the reference voltage generating means includes a plurality of resistor elements which are connected one another and generates reference voltages from the connected sections between the resistor elements. For example, the reference voltage generating means including $2^A$ resistor elements connected in series can generate $2^A+1$ (A=1, 2, ...) reference voltages, and designate $2^A$ pairs of the two reference voltages to the reference voltage selecting means by A bits (reference voltage selecting bits) of a digital signal.

Therefore, the resistance values of resistance elements can be set freely, allowing the increased flexibility in setting reference voltages and simpler structure of the reference voltage generating means.

A liquid crystal driving device in accordance with the present invention is arranged so as to include the DA converter.

With this arrangement having the DA converter, the liquid crystal driving device can restrain large increases in the number of circuit composing elements despite a display with more gradation levels and higher definition, therefore suppressing increases in manufacturing cost and being provided in a more compact size.

In general, when incorporating the DA converter in a liquid crystal driving device, the reference voltage selecting means should be provided to each liquid crystal driving output terminal. Especially, in a liquid crystal driving device for color display, a liquid crystal driving output terminal is required for each of the display data for three primary colors R, G, and B.

Therefore, the reduction in the size of the reference voltage selecting means, which occupies a large size in a liquid crystal driving circuit, permits a great reduction in chip size and substantially contributes to the resulting cost reduction. In addition, the reduction in the size of the circuit in a liquid crystal driving device allows a liquid crystal display device incorporating the liquid crystal driving device to be provided in a more compact size. Therefore, high quality display devices with higher resolution and more gradation display capabilities using increasingly large number of pixels can be realized, as well as more compact display devices can be provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital-to-analog converter for converting a digital signal to an analog signal by generating voltages of a plurality of levels and providing an output voltage based on reference voltages selected for the digital signal, said digital-to-analog converter comprising:

reference voltage generating means for generating the reference voltages;

reference voltage selecting means for selecting two reference voltages having adjacent voltage levels so as to include the voltage level of an output voltage between the voltage levels of the two reference voltages;

output voltage selecting means for selecting the voltage level of the output voltage from a plurality of voltage levels predetermined between the voltage levels of the two reference voltages; and output voltage generating means for generating a voltage having the voltage level selected by the output voltage selecting means as the output voltage, based on the two reference voltages.

2. The DA converter of claim 1, wherein:

said reference voltage generating means generates the reference voltages of $2^A+1$ different levels (A=1, 2, ...); and each of the digital signals composed of reference voltage selecting A bits for the two reference voltages to said reference voltage selecting means.

3. The DA converter of claim 2, wherein:

said reference voltage selecting means include switches which operate according to the reference voltage selecting bits.

4. A liquid crystal driving device comprising the DA converter of claim 2.

5. A liquid crystal driving device comprising the DA converter of claim 3.

6. The DA converter of claim 2, wherein:

said output voltage generating means generates the output voltage by linear interpolation based on the two reference voltages.

7. A liquid crystal driving device comprising the DA converter of claim 6.

8. The DA converter of claim 6, wherein:

each of the digital signals includes output voltage selecting B bits (B=2, 3, ...) for the voltage level of the output voltage to said output voltage selecting means; and said output voltage generating means includes weighting means for $2^C$-fold weighting (C=1, 2, ..., B−1) one of two reference voltages.

9. The DA converter of claim 8, wherein:

each of the digital signals is composed of the reference voltage selecting bits and the output voltage selecting bits; and the output voltage selecting bits are two bits.

10. A liquid crystal driving device comprising the DA converter of claim 9.

11. The DA converter of claim 8, wherein:

said output voltage selecting means include switches which operate according to the output voltage selecting bits.

12. A liquid crystal driving device comprising the DA converter of claim 11.

13. A liquid crystal driving device comprising the DA converter of claim 8.

14. The DA converter of claim 1, wherein:

said output voltage generating means generates the output voltage by linear interpolation based on the two reference voltages.

15. A liquid crystal driving device comprising the DA converter of claim 9.

16. The DA converter of claim 14, wherein:

each of the digital signals includes output voltage selecting B bits (B=2, 3, ... ) for the voltage level of the output voltage to said output voltage selecting means; and said output voltage generating means includes weighting means for $2^C$-fold weighting (C=1, 2, ..., B−1) one of two reference voltages.

17. A liquid crystal driving device comprising the DA converter of claim 16.

18. The DA converter of claim 1, wherein:

said reference voltage generating means is a resistance type potential divider circuit where a plurality of resistor elements are connected one another to generate reference voltages from the connected sections between the resistor elements.

19. A liquid crystal driving device comprising the DA converter of claim 6.

20. The DA converter of claim 1, wherein:

said output voltage generating means is a voltage follower circuit composed of differential pairs of transistors.

21. A liquid crystal driving device comprising the DA converter of claim 10.

22. A liquid crystal driving device comprising the DA converter of claim 1.

* * * * *